United States Patent [19]
Chen et al.

[11] Patent Number: 5,793,249
[45] Date of Patent: Aug. 11, 1998

[54] SYSTEM FOR PROVIDING TIGHT PROGRAM/ERASE SPEEDS THAT ARE INSENSITIVE TO PROCESS VARIATIONS

[75] Inventors: Jian Chen, San Jose; Lee E. Cleveland, Santa Clara, both of Calif.

[73] Assignee: Advanced Micro Devices, Inc., Sunnyvale, Calif.

[21] Appl. No.: 723,558

[22] Filed: Sep. 30, 1996

[51] Int. Cl.[6] ............................... H03K 3/26; H03G 3/12
[52] U.S. Cl. .......................... 327/561; 327/331; 327/332; 330/86; 330/282
[58] Field of Search ....................... 327/560, 308, 327/561, 562, 563, 315, 316, 323, 327, 328, 337, 331, 554, 332; 330/260, 278, 282, 284, 86

[56] References Cited

U.S. PATENT DOCUMENTS

| 4,100,437 | 7/1978 | Hoff, Jr. | 330/282 |
| 4,404,525 | 9/1983 | Amir et al. | 327/554 |
| 4,791,379 | 12/1988 | Hughes | 327/554 |

FOREIGN PATENT DOCUMENTS

| 56-164609 | 12/1981 | Japan | 330/282 |
| 58-29209 | 2/1983 | Japan | 330/86 |
| 60-105312 | 6/1985 | Japan | 330/284 |
| 62-154808 | 7/1987 | Japan | 330/282 |
| 2-95005 | 4/1990 | Japan | 330/282 |
| 666-631 | 6/1979 | U.S.S.R. | 330/86 |

OTHER PUBLICATIONS

IEEE Journal of Solid State Circuits, vol. SC–14, No. 6, Dec. 1979, "An Electrically–Programmably Switched Capacitor Filter" by Allstot et al., pp. 1034–1041.

"Electronic Circuits" published by McGraw–Hill, by Schilling et al., pp. 163–167, 1989.

*Primary Examiner*—Timothy P. Callahan
*Assistant Examiner*—T. T. Lam
*Attorney, Agent, or Firm*—Fliesler, Dubb, Meyer & Lovejoy

[57] ABSTRACT

The system and method of enhancing the yield of flash memory circuit is disclosed. The method comprises performing a diagonal erase of a select group of memory cells on a wafer during sort. If the memory cells do not erase in a satisfactory manner, the control voltage applied to the memory cell is adjusted based on the memory cell's erase time. The circuitry for providing the adjustment voltage includes trimming circuitry for an incrementally increasing the applicable control of voltage.

6 Claims, 3 Drawing Sheets

SYSTEM FOR PROVIDING TIGHT PROGRAM/ERASE SPEEDS THAT ARE INSENSITIVE TO PROCESS VARIATIONS

FIELD OF THE INVENTION

The present invention relates generally to improving the percentage yield of semiconductor devices and, more particularly, to a system and method for providing a controllably tight program/erase speed for flash memory cells that are insensitive to variations in the fabrication process.

BACKGROUND OF THE INVENTION

Processing yield is one of the most important factors semiconductor device manufacturers are concerned with. Yield, in simple terms, is defined as the number of properly operating devices present on a wafer as compared to the total number of devices fabricated on the wafer. When manufacturing flash memory devices, yield is particularly important since manufacturing is costly due to the large number of process steps required to fabricate such devices.

Generally, there are three distinct stages in the production of flash memory devices. The first stage comprises fabrication of the device. In the second stage, the devices are sorted and tested for proper operation. In the third stage, the devices are packaged and placed in a carrier for distribution and/or placement in an appropriate operating environment.

During the fabrication process, several layers of materials (i.e. polysilicon, oxide, photoresist, metals, etc.) are placed on a wafer in a specific pattern, with specific physical dimensions, to form a flash memory device. Process variations, such as too much or too little oxide, unequal channel length, and the like may result in some memory cells having non-uniform operating characteristics as compared to other memory cells fabricated on the same wafer. This is particularly true of flash memory cells which have channel lengths on the order of one-quarter micron.

When determining yield, particular attention is paid to the sorting stage, which historically produces the lowest yield. During the sorting stage, the memory cells present on a wafer are individually tested to determine whether the memory cells exhibit proper program and erase times. The testing is performed by applying a fixed, constant voltage the source, drain and gate of the memory cell. If, after application of the constant voltage to the source, drain and gate, the memory cell erases too fast or too slow, the memory cell is rejected, thereby having a negative effect on overall yield.

A drawback with conventional sort testing methods is that process variations are not taken into account. More specifically, in any particular lot of wafers there is the possibility that process variations will occur. Such variations may include non-uniform oxide thickness from device to device, non-uniform source and/or drain thickness and the like. These process variations can have a negative impact on the program and erase times of individual memory cell devices.

For example, if due to process variations, the source and drain widths are different from device to device, the coupling ratio of the various memory cells will differ with the varying widths, resulting in a potentially large change in erase time. Generally, when the coupling ratio changes, the erase time increases. Other problems, such as charge retention, read speed, write speed, and the like can also be adversely affected by process variations. The result of these process variations is low device yield, which negatively affects manufacturing margins.

Another drawback associated with conventional sort testing methods is that the voltage applied to the source, drain and gate of memory cells during the sort stage is fixed at a particular value. Because the voltage is fixed, there is no way to adjust for process variations. This inflexibility can have a negative affect on device yield.

Thus, there is a need to be able to stabilize the program and erase times of flash memory cells that is insensitive to process variations.

SUMMARY OF THE INVENTION

The present invention solves the aforementioned and related drawbacks associated with conventional sorting methods. The present invention is directed to a system to enhance the semiconductor device yield on a given wafer by controlling program and erase time fluctuations by performing a diagonal erase of the devices on a particular wafer; determining the erase times for the given devices; if the erase time is too slow, adjusting the voltage applied to the devices to compensate for speed. The voltages applied to the memory devices are furnished by a circuit including input means for carrying a reference signal; voltage means coupled to said input means, for adjusting said reference signal by a predetermined amount; amplifier means responsive to said voltage means for providing a control signal; and output means for delivering said control signal.

An advantage of the present invention is the ability to improve semiconductor device yield without altering the sorting process.

Another advantage of the present invention is the ability to control the program and erase voltages of the devices on a wafer.

A further advantage of the present invention is the ability to simplify the manufacturing process.

A feature of the present invention is that the program and erase adjustment circuit does not take up much physical space on the wafer.

Another feature of the present invention is that it can be implemented within existing manufacturing processes.

BRIEF DESCRIPTION OF THE DRAWINGS

These and other advantages and features of the present invention will become apparent from the following description of the embodiments, taken in conjunction with the accompanying drawings, where like numerals represent like elements, in which.

DETAILED DESCRIPTION OF THE EMBODIMENTS

The present invention relates to a circuit and a method of using the same for providing a controllably tight source and drain voltages that are coupled to a semiconductor memory device. The applied voltages are used to reduce the voltage sensitivity caused by process variations during device fabrication. By reducing the program and erase voltage sensitivity during sort, higher device yields per wafer can be attained.

The manufacturing process flow for producing a flash memory cell is depicted in Table 1 below. As shown in the table, the first stage is to start with the fabricated part. The first phase of the sorting process is called the parametric stage (parametrics), where the chips on a wafer are checked for short circuits and open circuits in the chip circuitry. The second phase of the sort process is the pre-erase stage (pre-erase), where the chips are put through a program and erase cycle to determine whether or not the program times and erase times meet the specifications for the part. The third phase of the sort process flow is the programming stage (program), where the devices that passed the pre-erase stage above are fully programmed. The fourth phase of the process is a full erase, (full erase) where all the chips on a wafer are fully erased by the erase procedure defined by the particular application. Finally, the devices are put through a final test (final test) where the devices on the wafer are patterned to test for speed and other parameters.

TABLE 1

| PROCESS FLOW |
| --- |
| FABRICATED PART ↓ |
| PARAMETRICS ↓ |
| PRE-ERASE ↓ |
| PROGRAM ↓ |
| FULL ERASE ↓ |
| FINAL TEST |

It is during the pre-erase phase that the circuit and method of the present invention is applied. As mentioned above, standard sort processes do not take process variations and their effect on program and erase voltages into account. However, process variations are taken into account according to the present invention.

According to the system and method of the present invention, during the pre-erase phase of the manufacturing process, a diagonal erase is performed by coupling a reference voltage ($V_{REF}$) to the memory devices along the diagonal of a particular wafer. The erase speeds of the devices are measured relative to the reference voltage, $V_{REF}$, applied. The erase speed versus applied voltage information is stored in a table, commonly referred to as a trimming table. If a memory device erases too slow, (below specification requirements) or has improper program and erase voltages, the reference voltage applied to the particular memory cell is adjusted. By adjusting the reference voltage applied to the memory cell, the erase time for the particular cell will also change due to the fact that erase time is an exponential function of the $V_{REF}$ ($10^x$ for every 0.1 volt change in $V_{REF}$).

Figure 1A:
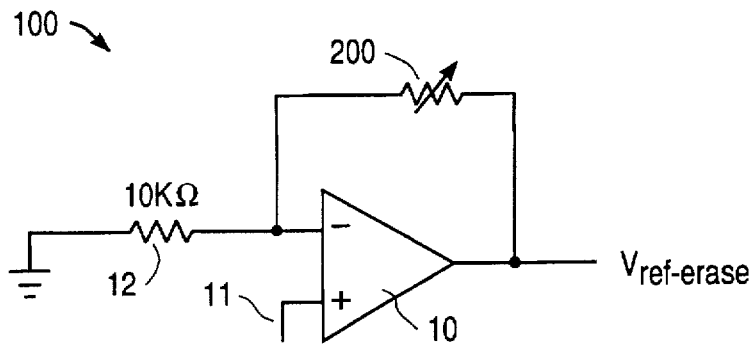
FIGS. 1(a)–1(c) depict circuit diagrams of a first embodiment of the adjustment circuit according to the present invention.
Figure 1B:
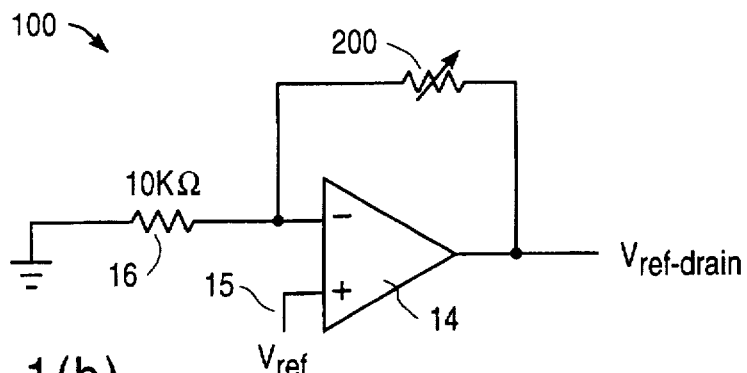
Figure 1C:
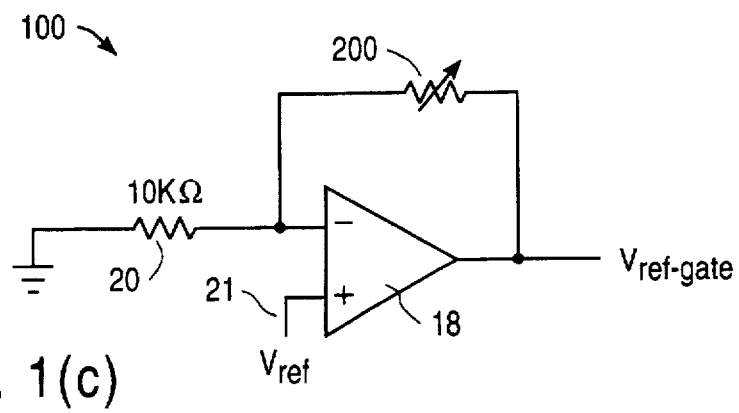

FIGS. 1(a)–1(c) depict the circuit diagram of a first embodiment of the programming circuit according to the present invention. In FIG. 1(a), a common reference voltage ($V_{REF}$) is applied to the non-inverting input of comparator 10 on line 11. The inverting input of the comparator 10 is connected to ground through a 10k Ω resistor 12. Connected between the 10k Ω resistor 12 and the inverting input of the comparator 10 is a trimming resistance circuit 200. The trimming resistance circuit is used to adjust the common voltage, applied to the memory cell, if needed. The trimming resistance circuit 200 is described in greater detail below in conjunction with FIG. 2. The output of the trimming resistance circuit 200 is coupled to the output of the comparator 10 to provide an erase reference voltage, $V_{REF-ERASE}$. $V_{REF-ERASE}$ is then coupled to a regulator circuit which regulates a high voltage supply (not shown) which supplies a voltage to the source of a memory cell, based on the value of $V_{REF-ERASE}$.

FIG. 1(b) depicts the common reference voltage, $V_{REF}$ being applied again to the non-inverting input of a comparator 14 on line 15. The inverting input of the comparator 14 is connected to ground through a 10k Ω resistor 16. Coupled between the 10k Ω resistor 16 and the inverting input of the comparator 14 is a trimming resistance circuit 200 used to adjust the common reference voltage applied to the comparator 14. The output of the trimming resistance circuit 200 is coupled to the output of the comparator 14 to provide the drain reference voltage, $V_{REF-DRAIN}$. The drain reference voltage is then coupled to a regulator circuit which regulates a high voltage supply (not shown), which supplies a voltage to the drain of a particular memory cell based on the valve of $V_{REF-DRAIN}$.

FIG. 1(c) depicts the circuitry used to provide the control gate reference voltage, $V_{REF-GATE}$. Here, the common reference voltage, $V_{REF}$, is applied to the non-inverting input of a comparator 18 on line 21. The inverting input of the comparator 18 is connected to ground through a 10k Ω resistor 20. A trimming resistance circuit 200 is coupled between the 10k Ω resistor 20 and the inverting input of the comparator 18. As with the erase reference voltage, ($V_{REF-ERASE}$) and the drain reference voltage, ($V_{REF-DRAIN}$), the trimming resistance circuit 200 is used to adjust the common reference voltage, $V_{REF}$, as needed based on the process variations from chip to chip. The output of the comparator 18, $V_{REF-GATE}$, is provided to a regulator circuit which regulates a high voltage supply (not shown) which provides the voltage that is coupled to the gate of memory cell based on the value of $V_{REF-GATE}$.

In operation, a common reference voltage ($V_{REF}$) of two volts (2V) is applied to the non-inverting input of comparator 10, thereby providing an erase voltage ($V_{REF-ERASE}$) at the output of the comparator 10. This voltage is applied to a regulator circuit similar to that presented in FIG. 4 with $V_{REF-ERASE}$ applied to the drain of initializing transistor 412 instead of $V_{REF}$. The regulator circuit regulates a high voltage supply (not shown), which provides the voltage applied to the source of a particular memory cell, based on the value of $V_{REF-ERASE}$, during the erase mode. Also, during the erase mode, a common reference voltage of two volts (2V) is applied to the comparator 18 on line 21. The output of the comparator 18 ($V_{REF-GATE}$) is applied to a regulator circuit similar to that presented in FIG. 3 with $V_{REF-GATE}$ applied to the non-inverting input of comparator 301 in place of $V_{REF}$. The regulator circuit regulates a high voltage supply (not shown), which provides a voltage to the control gate of the particular memory cell (not shown) being erased. The applied voltage is based on the value of $V_{REF-GATE}$.

The time needed to erase the particular memory is stored in a trimming table (not shown) along with the voltages applied to the gate and source to produce such an erase time. If the memory cell erases within the specified parameters, the memory cell then passes to the next stage in the process flow. On the other hand, if the memory cell does not erase within the target parameters, the trimming resistance circuit 200 (FIG. 2) is used to adjust $V_{REF}$ based on the previously calculated erase time, to increase the voltage applied to the source and gate of the memory cell based on the values present in the trimming table. For example, if due to process variations, it is determined that a particular memory cell is erasing too slowly, $V_{REF}$ is increased as required to increase the speed with which the memory cell erases. The trimming resistance circuit 200 incrementally adds voltage to $V_{REF}$ thereby increasing the $V_{REF-ERASE}$ to the required value. This latter increase in $V_{REF-ERASE}$ will then allow the memory cell to erase within the target parameters. By applying the additional voltage via trimming resistance circuit 200, one memory chip which may have failed due to an erase time being too slow, has been saved, thereby improving the yield.

Figure 2:
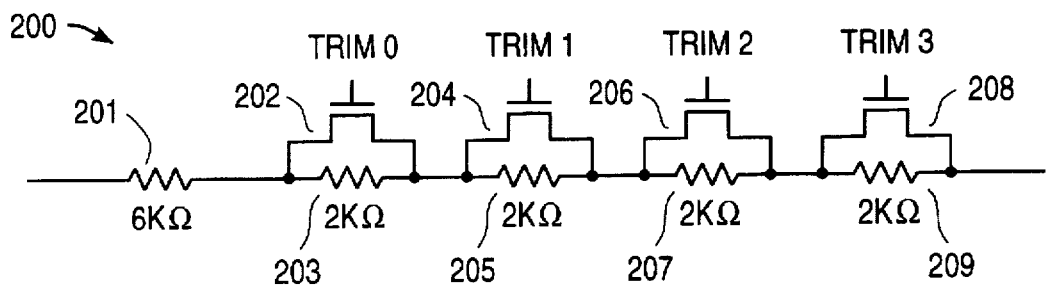
FIG. 2 is a schematic diagram of the variable voltage circuit according to the present invention.

FIG. 2 illustrates the variable trimming resistance circuit depicted in FIGS. 1(a)–(c). The trimming resistance circuit 200 is used to change the value of the particular control voltages, applied to the memory cell being tested which dependent on erase speed. The trimming resistance circuit 200 is comprised of a 6k ohm resistor 201 coupled to the source of a first transistor 202 that is connected in parallel to a 2k ohm resistor 203. The control gate of the first transistor 202 is connected to a TRIM0 line which is used to effect the reference voltage if needed. The drain of the transistor 202 is then coupled to the drain of a second transistor 204 having its control gate coupled to a TRIM1 line. Second transistor 204 is also connected in parallel to a 2k ohm resistor 205. The source of the second transistor 204 is coupled to the source of a third transistor 206. Third transistor 206, has a control gate connected to a TRIM2 line and a drain connected to the source of a fourth transistor 208. The third transistor 206 is coupled in parallel to a 2k ohm resistor 207. The fourth transistor 208 has its drain connected to the output of the amplifier as depicted above in FIGS. 1(a)–(c). The gate of transistor 208 is connected to a TRIM3 line which is used to increase the common reference voltage $V_{REF}$ as needed to obtain the proper operation of the flash memory cell (not shown) being tested.

In the embodiment shown in FIG. 2, the trimming transistors (202, 204, 206 and 208) are used to selectively remove the trimming resistors (203, 205, 207 and 209) from the trimming resistance circuit 200. The removal of the trimming resistors is based on the values present on TRIM0, TRIM1, TRIM2 and TRIM3. When a low signal (transistor off) is present on the control gates, the trimming resistors remain part of the trimming resistance circuit 200. When a high signal (transistor on) is present at the control gates the trimming resistor is shorted out and is removed from the trimming circuit 200.

In operation, the trimming resistance circuit 200 is used to provide the output reference control voltages of the circuits depicted in FIGS. 1(a)–1(c), by the relationship shown below:

$$V_{out} = \left(1 + \frac{R_{TRIM}}{R}\right) \cdot V_{REF} \quad (1)$$

Where $V_{OUT}$ represents the signal applied to the memory cell being tested (i.e. $V_{REF-ERASE}$, $V_{REF-DRAIN}$, $V_{REF-DATE}$); $R_{TRIM}$ represents the resistance of the trimming resistance circuit 200; and R represents the value of resistor 12, 16 and 20, respectively. For example, in a first embodiment of the present invention, when $V_{REF}$ has the value of 2V, the erase voltage applied to the source of the memory cell ($V_{REF-ERASE}$) being tested is –10V. In the situation where the output voltage ($V_{REF-ERASE}$, $V_{REF-DRAIN}$, $V_{REF-GATE}$) is within specification parameters and the memory cell is erasing properly, a high signal (logic 1 or 5V) is applied to the control gates of trimming transistors (202, 204, 206, 208) thereby removing the trimming resistors (203, 205, 207, 209) from trimming resistance circuit 200.

On the other hand, if the memory cell being tested erases too slow, additional voltage needs to be applied to the memory cell. This is accomplished by adding resistance to the trimming resistance circuit 200. This is done by providing a low signal (logic 0 or 0V) to the control gates of one or more of the trimming transistors (202, 204, 206, 208), thereby adding the corresponding resistance to the trimming circuit 200. The resulting increase in resistance increases the voltage applied to the memory cell being tested. The number of transistors turned off is determined by the trimming table which has been developed over many testing cycles. The greater the number of transistors that are turned off, the greater the overall resistance. The larger the overall resistance, the larger the voltage applied to the memory cell being tested.

Figure 3:
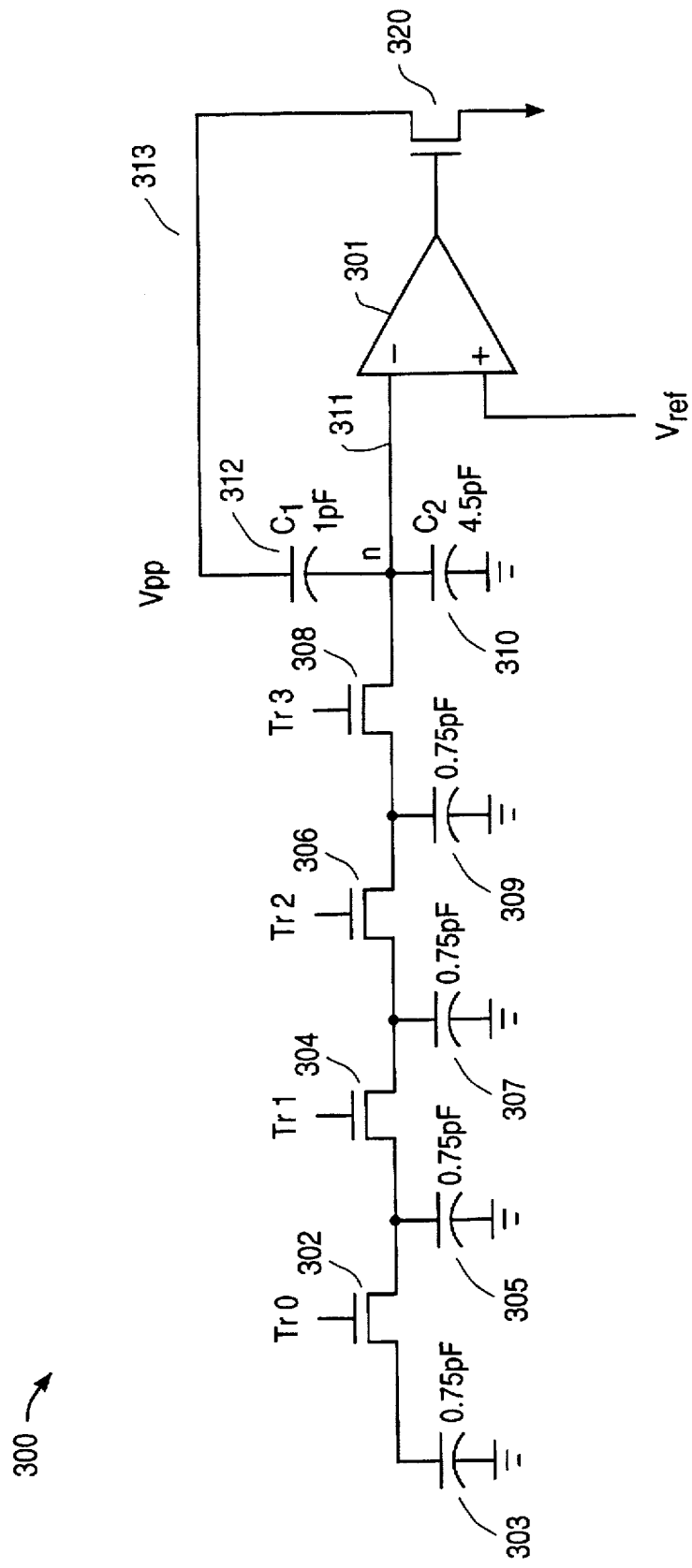
FIG. 3 is a circuit diagram of a second embodiment of the adjustment circuit according to the present invention.

FIG. 3 illustrates a second embodiment of the adjustment circuitry used to control the program/erase signals applied to flash memory circuits according to the present invention. The second embodiment depicted in FIG. 3 differs from the first embodiment depicted in FIGS. 1(a)–1(c) in that the common reference voltage ($V_{REF}$) does not change all the control voltages simultaneously. It only changes those voltages that need to be adjusted.

As shown in FIG. 3, a first capacitor 303 having a capacitance of 0.75 oF is connected to the source of a first transistor 302. The drain of transistor 302 is coupled to a 0.75 oF capacitor 305 the end of which is connected to ground. The control gate of transistor 302 is connected to the output (Tr0) of a first means (fuse, programmable element, etc.) operative to provide a signal having a high or low value. The 0.75 oF capacitor 305 is coupled to the drain of a second transistor 304. The control gate of transistor 304 is connected to the output (Tr1) of a second means (not shown) for providing a signal having either a high or a low value. The source of transistor the second transistor 304 is then connected to the drain of third transistor 306 via a 0.75 oF capacitor 307. Capacitor 307 is also coupled to ground. The source of the third transistor 306 is connected to a 0.75 oF capacitor 309 which, in turn is coupled to the drain of a fourth transistor 308. The 0.75 oF capacitor 309 is also coupled to ground. The control gate of the third transistor 306 is connected to the output (Tr2) of a third means (not shown) for providing a signal having either a high or a low value. The source of transistor 308 is coupled to a capacitive network consisting of a first ($C_1$) capacitor 312 having a capacitance of 1 oF and a second ($C_2$) capacitor 310 having a capacitance of 4.5 oF. The control gate of the fourth transistor 308 is connected to the output (Tr3) of a fourth means (not shown) for providing a signal having either a high or low value. The Capacitor 310 is connected to ground.

According to the method of the present invention the ratio of $C_2$ to $C_1$, the output of the capacitive network is connected to the non-inverting input of a comparator 301, via line 311. The inverting input of comparator 301 is connected to the common reference voltage, $V_{REF}$. The output of the comparator 301 is coupled to a transistor 320. The comparator 301 and transistor 320 comprise a positive voltage regulator circuit. As depicted in FIG. 3, the programming voltage of note is $V_{pp}$ present on line 313. According to the method of the present invention, the output voltage of the circuit 300 ($V_{pp}$) is 10 volts.

Under normal operating conditions, the common reference voltage, $V_{REF}$, is applied to the non inverting input of comparator 301. The corresponding output voltage, $V_{pp}$, is represented by:

$$V_{pp} = V_{REF} \cdot \frac{C_{TOTAL}}{C_1} \quad (2)$$

where $C_{TOTAL}$ is the effective capacitance of capacitor 310 plus the effective capacitance of the capacitive circuitry (trimming resistance circuit) coupled to node n. More specifically, under normal operating conditions, with $V_{REF}$ equal to two volts (2V) the output voltage, $V_{pp}$, should be about 10V. This result can be obtained directly from equation 2 above.

On the other hand, if a memory cell being tested programs or erases too slow ($V_{pp}$ needs to be increased) the effective capacitance of capacitor 310 is adjusted by the circuit of the present invention. Based on the trimming table values, the control transistors 302, 304, 306 and 308 are turned on by the application of a high signal on control gates Tr0, Tr1, Tr2 and Tr3, respectively. By applying a high signal to the various control gates, the capacitors connected to node n are connected to ground, thus being removed from the circuit. Conversely, applying a low signal to the various control gates adds the capacitance to capacitor $C_2$ thus increasing the total output capacitance acting on $V_{REF}$. This increased capacitance increase the voltage. $V_{pp}$, applied to the memory device being tested. As shown, by adjusting the output voltage, $V_{pp}$, without regard to process variations an otherwise inadequate memory cell now will be passed on to the subsequent phases of the manufacturing process; thereby increasing the overall yield of a wafer.

Figure 4:
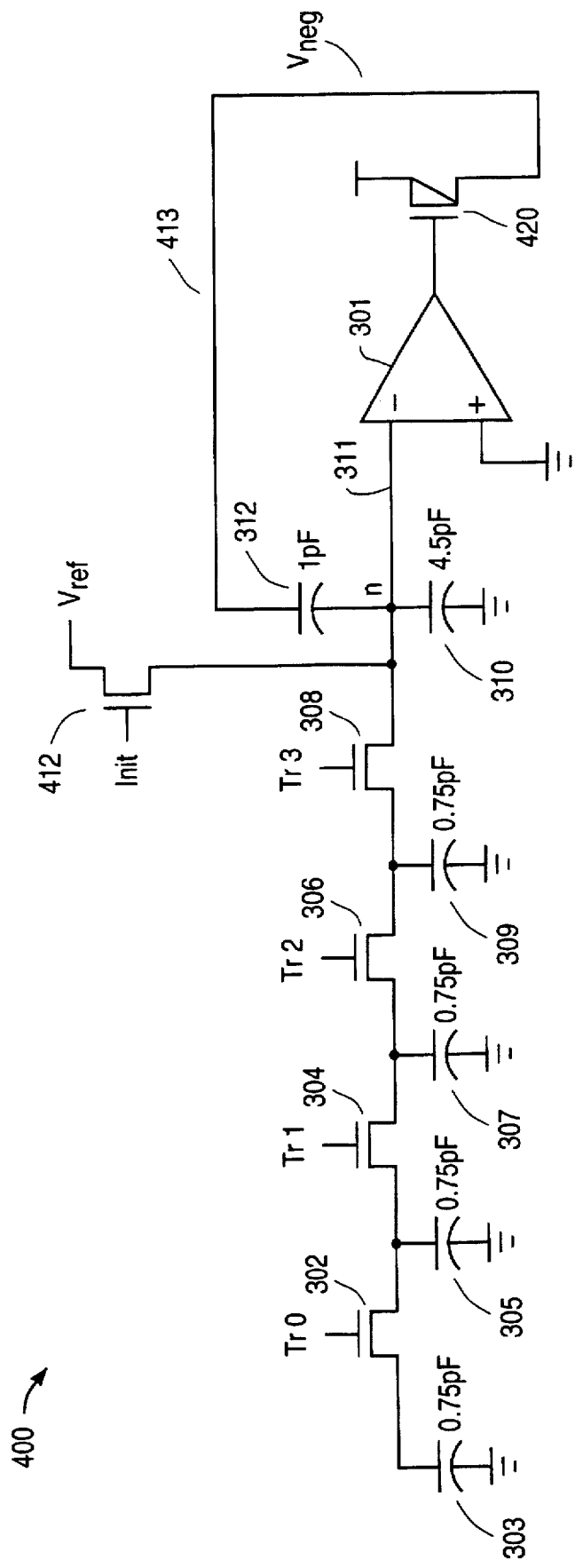
FIG. 4 is a circuit diagram of a third embodiment of the adjustment circuit according to the present invention.

FIG. 4 illustrates a third embodiment of the adjustment circuitry used to control the program/erase signals applied to flash memory circuits according to the present invention. The third embodiment depicted in FIG. 4 differs from the second embodiment depicted in FIG. 3 in that the reference voltage, $V_{REF}$, is connected between the fourth transistor 308 and the capacitive network 310, 312, via initializing transistor 412. Also, the n-channel transistor 320 of the second embodiment is replaced with a p-channel transistor 420.

The negative voltage regulator of FIG. 4 has the same operating characteristics as the positive voltage regulator of FIG. 3, except that initially the circuit is set to $V_{REF}$ by placing a high signal (logic 1 or 5V) on the control gate of initializing transistor 412. After being initially set to $V_{REF}$, the voltage present on line 413 is pulled to $-10V$ by the p-channel transistor 420 which is represented by:

$$V_{NEG} = -V_{REF} \cdot \frac{C_{TOTAL}}{C_1} \quad (3)$$

Where $C_{TOTAL}$ is the effective capacitance of capacitor 310 plus the effective capacitance of the capacitive circuity (trimming resistance circuit) coupled to node n. More specifically, under normal operating conditions, with $V_{REF}$ equal to 2V the output voltage, $V_{NEG}$, should be about $-10V$. During the same time period, the votage present at node n drops to 0V.

As shown in the embodiments discussed above, the ability to alter the control voltages used to test (program/erase) memory cells is performed independent in process variations. The process variations determine whether or not the reference voltage has to be adjusted in any manner; however, it is the adjustment circuit which performs the adjustments independent of those same process variations. Although the discussion centered around negative gate erase operation, it is noted that the trimming circuit and method of the present invention is also appropriate for positive gate erase operation.

The foregoing description of the embodiments of the present invention has been presented for the purposes of illustration and description. It is not intend to be exhaustive or to limit the invention to the precise form disclosed, and obviously, many modifications and variations are possible in light of the above teachings. Thus, further aspects and embodiments of the present invention can be determined by a study of the specifications, drawings, and the claims by those skilled in the art. It is intended that the scope of the invention be defined by the claims appended hereto.

What is claimed is:

1. A circuit for providing a tight signal, comprising:

an input terminal operative to carry a reference signal;

voltage circuitry operative to adjust said reference signal by a predetermined amount, said voltage circuitry comprising:

a first transistor; a first capacitor; a second transistor; a second capacitor; a third transistor; a third capacitor; a fourth transistor; a fourth capacitor; and a capacitor network, said first transistor coupled between said first and second capacitors, said second transistor coupled between said second and third capacitors, said third transistor coupled between said third and fourth capacitors, said fourth transistor coupled between said fourth capacitor and said capacitor network, said capacitor network further including a fifth capacitor and a sixth capacitor connected in series with said fifth capacitor;

an amplifier responsive to said voltage circuitry, said amplifier operative to provide said tight signal; and an output terminal operative to deliver said tight signal.

2. The circuit of claim 1, wherein said fifth capacitor and said sixth capacitor have a capacitance ratio of 4.5.

3. A circuit for providing a tight signal, comprising:

an input terminal operative to carry a reference signal;

voltage circuitry operative to adjust said reference signal by a predetermined amount, said voltage circuitry comprising:

a first transistor; a first capacitor; a second transistor; a second capacitor; and a capacitor network, said first transistor coupled between said first and second capacitors, said second transistor coupled between said second capacitor and said capacitor network, said capacitor network further including a third capacitor and a fourth capacitor connected in series with said third capacitor;

an amplifier responsive to said voltage circuitry, said amplifier operative to provide said tight signal; and an output terminal operative to deliver said tight signal.

4. The circuit of claim 1, wherein said third capacitor and said fourth capacitor have a capacitance ratio of 4.5.

5. A circuit for providing a tight signal, comprising:

an input terminal operative to carry a reference signal;

voltage circuitry operative to adjust said reference signal by a predetermined amount, said voltage circuitry comprising:

a first transistor; a first capacitor; a second transistor; a second capacitor; a third transistor; a third capacitor; and a capacitor network, said first transistor coupled between said first and second capacitors, said second transistor coupled between said second and third capacitors, said third transistor coupled between said third capacitor and said capacitor network, said capacitor network further including a fourth capacitor and a fifth capacitor connected in series with said fourth capacitor;

an amplifier responsive to said voltage circuitry, said amplifier operative to provide said tight signal; and an output terminal operative to deliver said tight signal.

6. The circuit of claim 5, wherein said fourth capacitor and said fifth capacitor have a capacitance ratio of 4.5.

* * * * *